(12) United States Patent
Daubenspeck et al.

(10) Patent No.: US 7,704,804 B2
(45) Date of Patent: Apr. 27, 2010

(54) METHOD OF FORMING A CRACK STOP LASER FUSE WITH FIXED PASSIVATION LAYER COVERAGE

(75) Inventors: Timothy Daubenspeck, Colchester, VT (US); Jeffrey Gambino, Westford, VT (US); Christopher Muzzy, Burlington, VT (US); Wolfgang Sauter, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 41 days.

(21) Appl. No.: 11/953,363

(22) Filed: Dec. 10, 2007

(65) Prior Publication Data

US 2009/0149013 A1   Jun. 11, 2009

(51) Int. Cl.
   *H01L 21/82* (2006.01)
(52) U.S. Cl. ............. 438/132; 257/529; 257/E21.592
(58) Field of Classification Search ........... 438/132; 257/529, E21.592
   See application file for complete search history.

(56) References Cited

U.S. PATENT DOCUMENTS

| | | | |
|---|---|---|---|
| 5,139,852 A | 8/1992 | Baise et al. | |
| 5,723,898 A | 3/1998 | Gilmour et al. | |
| 5,834,829 A | 11/1998 | Dinkel et al. | |
| 6,486,526 B1 | 11/2002 | Naratan et al. | |
| 6,495,918 B1 | 12/2002 | Brintzinger | |
| 7,479,447 B2 * | 1/2009 | Daubenspeck et al. | 438/601 |
| 2001/0005617 A1 | 6/2001 | Feurle et al. | |
| 2001/0054745 A1 | 12/2001 | Tsai | |
| 2002/0017704 A1 | 2/2002 | Yajima | |
| 2002/0113291 A1 | 8/2002 | Adkisson et al. | |
| 2003/0227089 A1 | 12/2003 | Watanabe et al. | |
| 2004/0129938 A1 | 7/2004 | Landers et al. | |

* cited by examiner

*Primary Examiner*—W. David Coleman
(74) *Attorney, Agent, or Firm*—Robert Walsh

(57) ABSTRACT

A crack stop void is formed in a low-k dielectric or silicon oxide layer between adjacent fuse structures for preventing propagation of cracks between the adjacent fuse structures during a fuse blow operation. The passivation layer is fixed in place by using an etch stop shape of conducting material which is formed simultaneously with the formation of the interconnect structure. This produces a reliable and repeatable fuse structure that has controllable passivation layer over the fuse structure that is easily manufactured.

20 Claims, 7 Drawing Sheets

METHOD OF FORMING A CRACK STOP LASER FUSE WITH FIXED PASSIVATION LAYER COVERAGE

RELATED PATENT APPLICATION

This application is related to a commonly assigned non-provisional application Ser. No. 11/277,398 filed on Mar. 24, 2006 which was based on a provisional application Ser. No. 60/594,395, "Crack Stop Void Formed in a Low-k Dielectric Layer Between Adjacent Fuses", filed Apr. 4, 2005, and incorporated in its entirety herein by reference.

FIELD OF THE INVENTION

This invention relates generally to integrated circuits and, more particularly, to protection of fuses formed in a low-k dielectric layer from damage when employing a laser beam in a fuse blow operation. The crack stop void is formed simultaneously with the formation of an interconnect structure along with a portion of the conductor layer over the fuse.

BACKGROUND OF THE INVENTION

Semiconductor integrated circuits (IC) and their manufacturing techniques are well known in the art. In typical integrated circuits, a large number of semiconductor devices are fabricated on a silicon substrate. To achieve the desired functionality, a plurality of conductors or interconnects are typically employed for coupling selected devices together. In some integrated circuits, some of the conductive links may be coupled to fuses which may be selectively programmed (i.e. blown) after fabrication using lasers. By way of example, in a logic integrated circuit, fuses may be employed during manufacturing to protect from destruction some of the gate stacks of the transistors from inadvertent built-up of electrostatic charge. Once the fabrication of the IC is substantially complete, the fuses may be blown or cut to permit the logic circuit to function as if the protective current paths never existed. More commonly, fuses may be employed for repairing defects found in the logic circuit by appropriate replacement of defective elements with redundancy replacement elements present within or without the chip.

Fuses may be selectively blown or programmed with a laser beam. Once blown, the fuse changes from a highly conductive state to a highly resistive state (i.e. non-conductive) which inhibits current from flowing through it and represents an open circuit to the path taken by the current. Typically, a fuse is formed of a metallic material and the laser beam imparts enough energy into the fuse to melt the metal. The fuse is formed in a dielectric material such as silicon oxide and a silicon oxide dielectric layer formed over the fuse. Energy delivered from the laser is transmitted through the surrounding silicon oxide dielectric layers. Since silicon oxide is a relatively "rigid" material, it is possible to blow the fuse with minimal damage to the surrounding dielectric layers using conventional fuse structure with sufficient distance between fuses. Thus, the risk of incorrectly programming one fuse when programming another nearby fuse is relatively low. FIG. 1 shows fuses 10A-C formed in a silicon oxide dielectric layer 15. Fuse 10A has been "blown" open by a laser (not shown). It is noted that there is minimal damage 16 of the silicon oxide dielectric layer 15 such that adjacent fuses 10A and 10C are not adversely affected by the blowing of fuse 10B.

A trend in the fabrication of integrated circuits is the use of "low-k" dielectric material in an inter-level dielectric layer to reduce parasitic capacitance between interconnects (e.g. wires and vias) resulting in an increase in the speed of devices. Fuses are typically formed in the same inter-level dielectric layer as the interconnects. The use of low-k dielectrics in the back-end-of-line (BEOL) levels can result in a reduction in the material strength of the inter-level dielectric layer. For example, having layers of silicon oxide dielectric (e.g. a rigid material) and low-k dielectric (e.g. a non-rigid material) formed upon each other have resulted in separation of the different material layers when placed under a physical stress. The separation of the inter-level dielectric layers can result in yield or reliability issues due to, for example, exposure of interconnects to air (e.g. corrosion of metal interconnects). Since fuses are formed in the same inter-level dielectric layer as interconnects, fuses are also susceptible to damage.

Thus, fuses are typically formed in silicon oxide layers above the low-k dielectric layers. It is desirable to create a reliable and predictable fuse structure which could be used for low-k or silicon oxide dielectric materials.

SUMMARY OF THE INVENTION

It is an aspect of the present invention to provide a method of forming fuses in a low-k or silicon oxide dielectric layer that are spaced apart with minimal distances in a repeatable in semiconductor manufacturing process.

It is another aspect of the present invention to provide a method of forming fuses in a low-k dielectric layer having high reliability and high yield.

The above and other aspects and advantages, which will be apparent to one of skill in the art, are achieved in the present invention which is directed to, in an aspect, a method thereof comprising the steps of providing a substrate including a plurality of fuse structures formed thereupon; and simultaneously forming a material-free region between adjacent ones of the fuse structures while removing a portion of a conductor layer to form an interconnect structure.

In another aspect, the present invention is directed to a method thereof comprising the steps of providing a substrate including a plurality of fuse structures formed in a first dielectric layer; forming at least a second dielectric layer over the plurality of fuse structures; forming an opening in the at least second dielectric layer between adjacent ones of the fuse structures; forming a conductor layer on the second dielectric layer filling the opening; and patterning the conductor layer to simultaneously form a first interconnect structure and a void in the opening, wherein the void prevents propagation of cracks between the adjacent fuse structures during a fuse blow operation. A problem with previous trench crack stop methodology particularly when copper is used in the last metal level fuses depends on its ultimate reliability upon a well controlled set of critical parameters which define the overall process window. The solution is to produce a fuse dielectric over-passivation thickness that does not vary from fuse to fuse, chip to chip, wafer to wafer, and lot to lot because of the nonuniformity of the RIE process and thickness of the dielectric material that must be etched.

In the present invention, the fuse crack stop is created using a pattern-conformal aluminum fuse over-plate created at the top most aluminum pad (TD) or pad/wiring (LB) layer, the edges of which serve as the mask edges in the definition of the interfuse crack stop. In this case the interfuse crack stop is created by a vertical etch occurring after the TD or LB layers are completely formed. The over plate aluminum acts to mask the over-fuse passivation during all processing subsequent to the aluminum deposition (including the vertical dielectric RIE process to open the pad via and create the interfuse crack stop. Thus the over-fuse passivation is fixed at the as-deposited thickness, at all fuse locations, resulting in a very consistent and uniform fuse passivation coverage thickness across all parts

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF EMBODIMENTS OF THE INVENTION

The present invention may be used when reliable and repeatable fuse structures having controllable passivation are required, such as, silicon oxide have passivation layers at minimal fuse pitch, or fuse passivation over low-k material, or multi-layers of low-k material surround the fuse. This invention is particularly suited in situations where laser fuse integration is necessary in multiple layers of low-k materials are used in which there is a reduction in adhesion of materials. The reduction in material adhesion can lead to excessive delaminating, cracking or cratering (hereinafter referred to as "damage") of the materials which can cause reliability and/or yield degradation by incorrectly programming a nearby fuse. One solution is to space the fuses further apart from each other but this will increase the layout footprint (i.e. area) of the fuse bank for a given design. Another solution is to form a void between adjacent fuses as described in, for example, commonly assigned U.S. patent application Ser. No. 11/277,398, however, when a final passivation layer (e.g. dielectric) is required over a last wiring level then portions of the passivation layer form in the void and diminish the effectiveness of the void as a damage barrier since passivation material in the void provides a pathway for damage to propagate through the passivation-filled damage barrier. A solution to allow for the removal of passivation material from the void would be to increase the size of the void but this will consume much of the area between adjacent fuses thus limiting future fuse pitch reduction.

Figure 1:
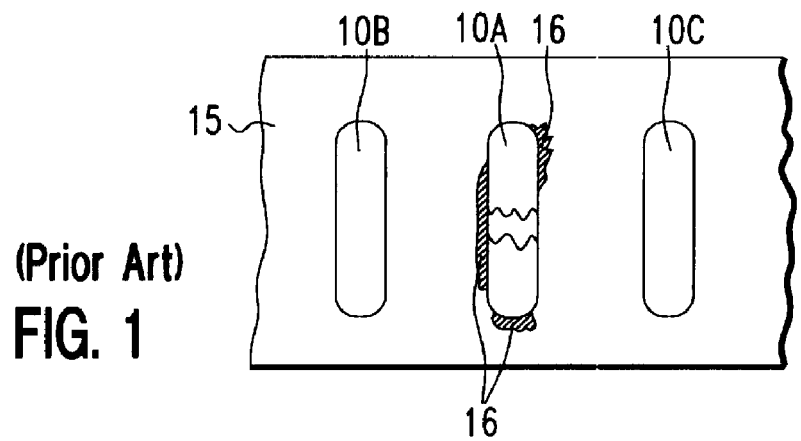
FIG. 1 is a top view of a conventional fuse structure.
Figure 2A:
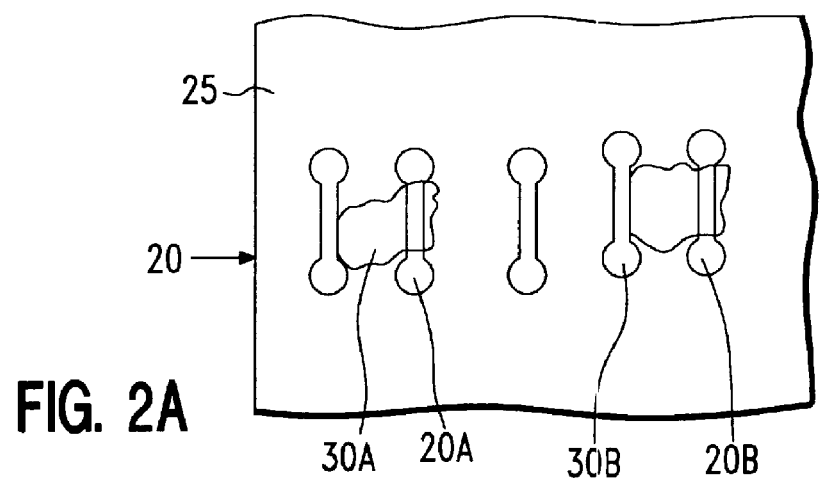
FIGS. 2A-B are top and cross-sectional views, respectively, illustrating damage imparted to a fuse structure after a fuse blow operation.
Figure 2B:
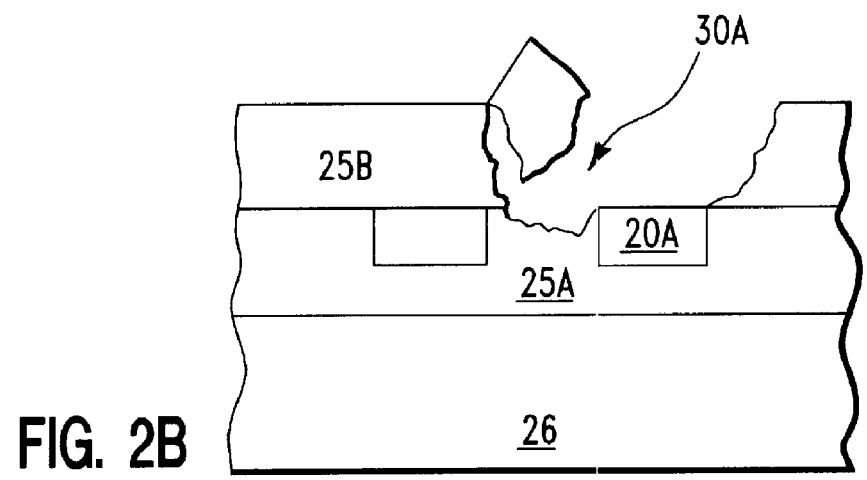
Figure 3:
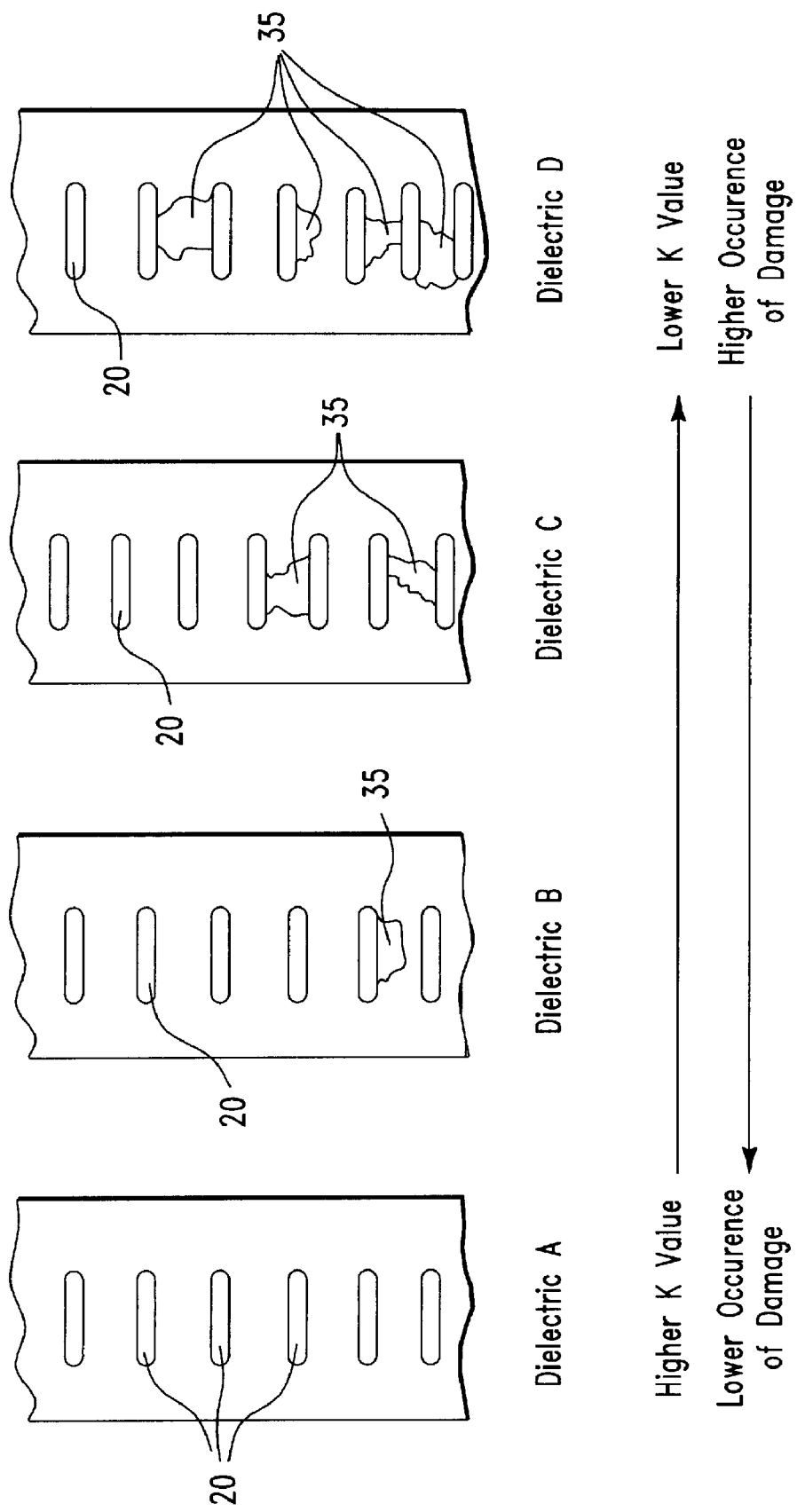
FIG. 3 illustrates a relationship between the dielectric constant of various dielectric layers and the occurrence of damage to the dielectric layer due to a fuse blow operation.

Referring to FIGS. 2A and 2B, fuse bank 20 includes fuses 20A and 20B formed in a dielectric layer 25 on substrate 26. Fuses 20A and 20B can be formed from a metal such as, for example, copper or aluminum. Dielectric layer 25 can include multiple dielectric layers such as, for example, a low-k (dielectric constant) layer 25A and another dielectric layer 25B (e.g. silicon nitride and/or silicon oxide) having a higher k dielectric constant value compared to low-k dielectric layer 25A. A low-k dielectric material has a relative permittivity of 4 or less, examples of which include but are not limited to hydrogen silsesquioxane polymer (HSQ), methyl silsesquioxane polymer (MSQ), SiLK™ (polyphenylene oligomer) manufactured by Dow Chemical, Midland, Mich., Black Diamond™ ($SiO_x(CH3)_y$) manufactured by Applied Materials, Santa Clara, Calif., fluorinated TEOS (FTEOS) and fluorinated silicon glass (FSG). It has been observed that during a fuse blow operation where fuses 20A and 20B are opened by a laser (not shown), damage 30A and 30B of dielectric layer 25 occurs due to delamination of the silicon nitride/silicon oxide dielectric layer 25B from the low-k dielectric layer 25A (see FIG. 2B). As shown in FIG. 2A, damage 30A, 30B can extend to an adjacent un-blown fuse causing reliability and/or yield degradation of the adjacent un-blown fuse due to exposure to the external environment (e.g. air, moisture, temperature cycling). The adjacent un-blown fuse can oxidize when exposed to the external environment resulting in an increase in electrical resistance. FIG. 3 shows a trend that for dielectric materials having a lower dielectric constant (i.e. "k value"), the occurrence of damage 35 caused by a fuse blow operation increases.

Figure 4:
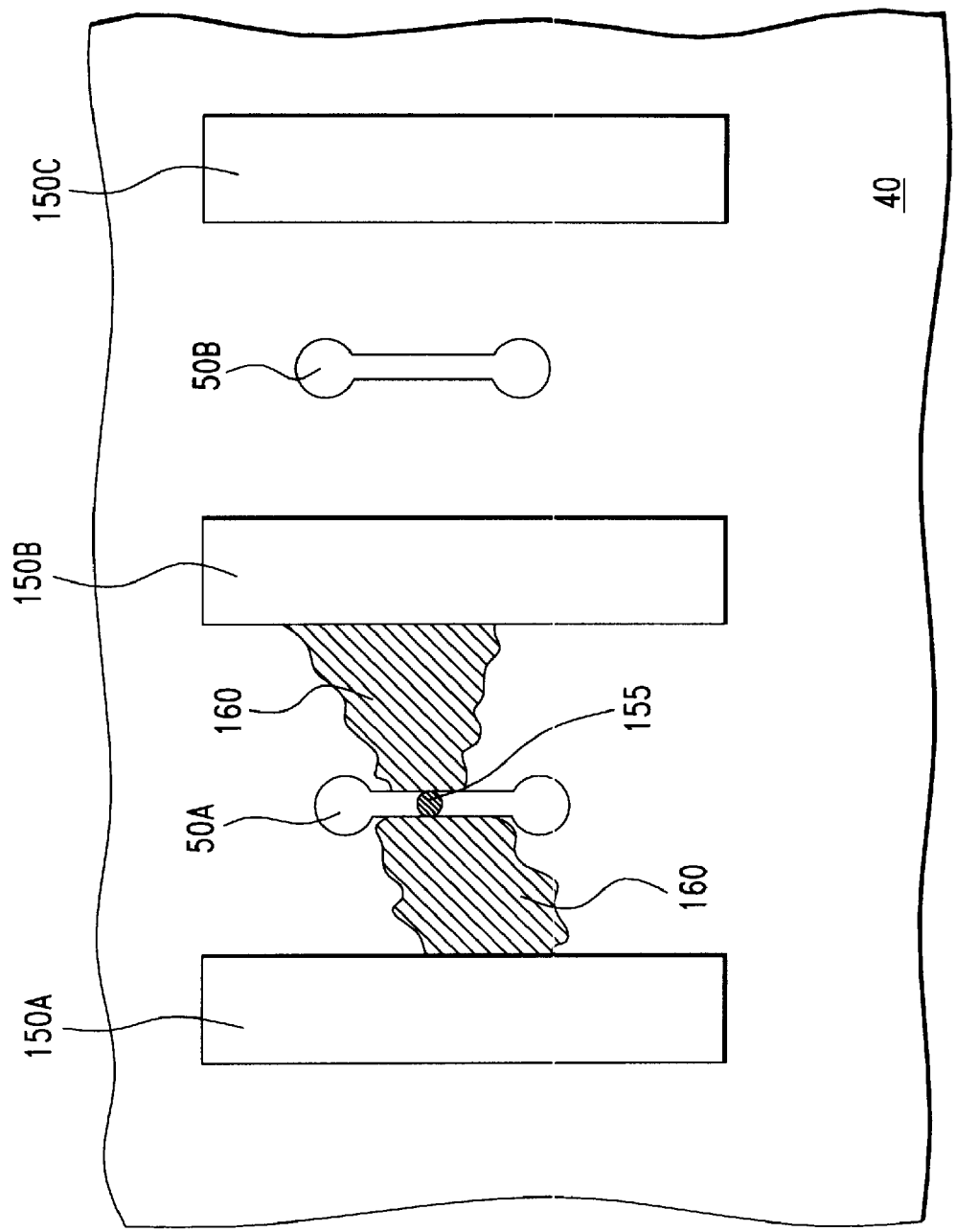
FIG. 4 is a top view of a fuse structure according to the present invention.

According to an embodiment of the invention shown in FIG. 4, fuse structures 50A and 50B (e.g. metal fuses) are formed on substrate 40 in a low-k or silicon oxide dielectric layer (described hereinafter with reference to FIGS. 5A-H). Material-free regions 150A-C are formed adjacent to fuses 50A and 50B in the immediate vicinity of the region 155 where the fuse is to be blown by a laser (not shown). Material-free regions 150A-C are absent of solid material so that a "void" is formed between adjacent fuses 50A and 50B. Voids 150A-C comprise a fluid (e.g. gas or air) or a vacuum. Voids 150A and 150B prevent damage 160 in the dielectric layers caused by a fusing operation on fuse 50A from propagating to an adjacent fuse (e.g. fuse 50B). As such, voids 150A-C could also be referred to as "crack arresting structures" or "crack stops". Each of material-free regions 150A-C will be hereinafter referred to as a "crack stop void" for sake of clarity. A depth of a crack stop void is defined by an over-etch step during formation of a circuit structure such as, for example, an interconnect structure (e.g. a conductive transfer pad such as a wire bond pad or a C4 landing pad). Thus, according to the invention, crack stop voids are formed without requiring additional masks or process steps which reduces process complexity and costs. It has also been observed that wafers having crack stop voids incorporated into the fuse structures have a lower number of reliability fails compared to wafers which do not have crack stop voids.

In conventional integrated circuit fuse designs, fuses placed in a row inside a fuse bank cannot be reliably used when fuse pitches (i.e. distance between adjacent fuses) fall below approximately 3 micrometers (um). This is because lasers that are typically used for blowing fuses have a wavelength of the order of about 1 to about 1.3 um. As a result, the smallest spot that can be focused is greater than about 2 to 2.6 um. This, coupled with the uncertainty associated with the positioning of the substrate relative to the laser spot renders the blowing of fuses an unreliable operation. For fuse pitches less than 3 um, the probability of damaging a neighboring fuse increases as the pitch decreases. The introduction of a crack stop filled with material (e.g. metal) between fuses will also not work at these tight pitches since the crack stop itself will be ablated by the laser causing damage to fuses or circuit elements next to it. In the invention described herein, since the crack stop void is made by removing material, damage to the crack stop void due to the laser beam is virtually eliminated. This makes it possible to space fuses even down to a pitch of about 2.2 um without damaging neighboring fuses during fuse blow. Moreover, the crack stop void still performs the function of stopping cracks from damaging neighboring fuses. Thus, spacing of fuses consistent with conventional silicon oxide fuse integration is achieved without an increase in foot print.

In laser fuse integration where copper is the last metal level, fuses ultimately depend on the reliability of a well-controlled set of critical parameters which define the overall process window. The most important process window variables include the specific laser parameters and the fuse structure consistency from part to part, the latter of which is primarily dependent upon over-fuse dielectric passivation thickness. However, that process inherently produces fuse dielectric over-passivation thickness variation from fuse-to-fuse, chip-to-chip, wafer-to-wafer, and lot-to-lot depending on the nonuniformity of the RIE process and the thickness of the dielectric material that must be etched.

In the present invention, the fuse crack stop void is created using a pattern-conformal aluminum fuse over-plate created at TD or LB layer, the edges of which serve as the mask edges in the definition of the interfuse crack stop void. In this case the interfuse crack stop void is created by a vertical etch occurring after the TD and LV levels are formed. The over plate aluminum acts to mask the over-fuse passivation during all processing subsequent to the aluminum deposition (including the vertical dielectric RIE process to open the pad via and create the interfuse crack stop void. Thus the over-fuse passivation is fixed at the as-deposited thickness, at all fuse locations, resulting in a very consistent and uniform fuse passivation coverage thickness across all parts.

Figure 5A:
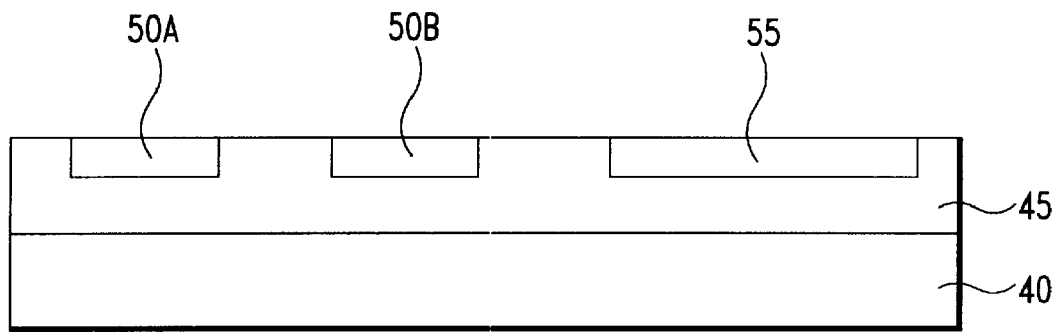
FIGS. 5A-H illustrates exemplary steps for producing the crack stop void of the present invention.

Referring now to FIGS. 5A-H, a method of forming a crack stop void according to an embodiment of the invention will be described. FIG. 5A shows substrate 40 (e.g. silicon, silicon-on-insulator, silicon germanium or gallium arsenide) including a low-k dielectric layer 45 (e.g. SiLK, SiCOH, Black Diamond, FTEOS, or FSG) or silicon oxide dielectric when closer spacing or accurate positioning is required formed thereupon. Low-k dielectric layer 45 can be formed in an interconnect level in a BEOL process. Fuses 50A and 50B can be formed in low-k dielectric layer 45 by conventional processes such as, for example, a damascene process including photolithography, deposition of metal and chemical mechanical polishing. Also formed in low-k dielectric layer 45 on the same interconnect level as fuses 50A and 50B is an interconnect structure 55 (e.g. wiring pad).

Figure 5B:
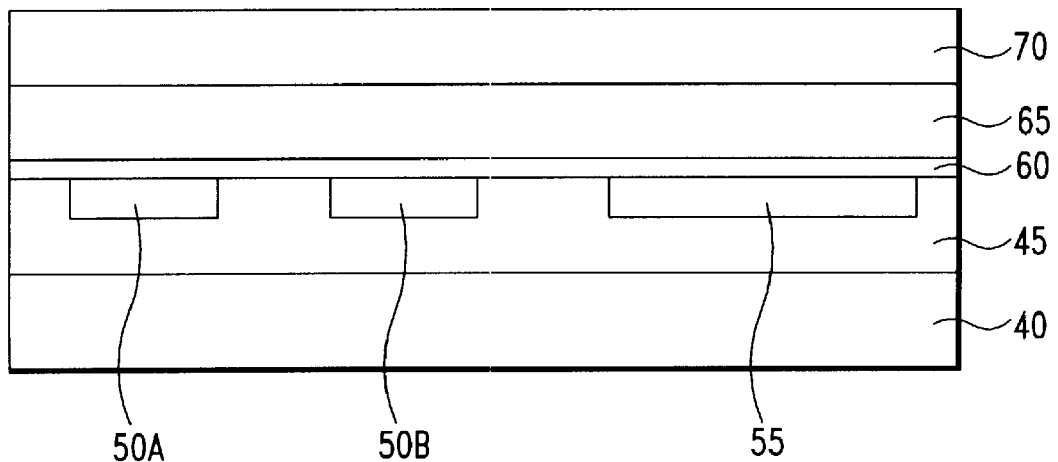

Dielectric layers 60, 65 and 70 used for final passivation layer 45 are formed on dielectric layer 45 as shown in FIG. 5B by a conventional deposition process such as chemical vapor deposition (CVD). In an exemplary process, dielectric layer 60 comprises silicon nitride having a thickness from about 50 nanometers (nm) to about 150 nm; dielectric layer 65 comprises silicon oxide having a thickness from about 250 nm to about 650 nm; and, dielectric layer 70 comprises silicon nitride having a thickness from about 200 nm to about 600 nm. Dielectric layer 60 serves as an etch-stop for a subsequent reactive ion etch step (see FIG. 5D) while dielectric layers 65 and 70 serve as passivation layers. Optionally, more than three or less than three dielectric layers could be formed on low-k dielectric layer 45 according to specific requirements.

Figure 5C:
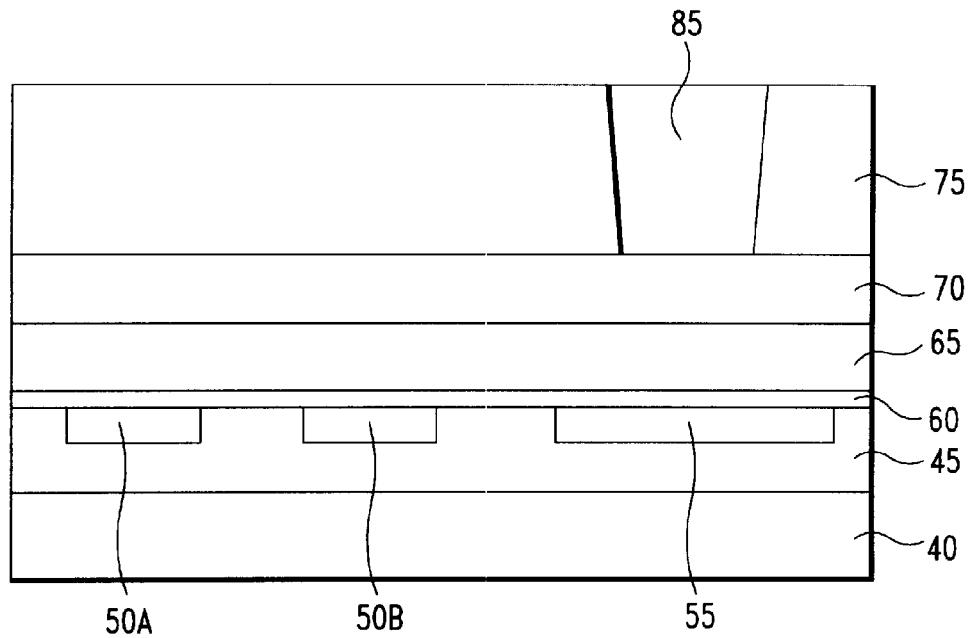
Figure 5D:
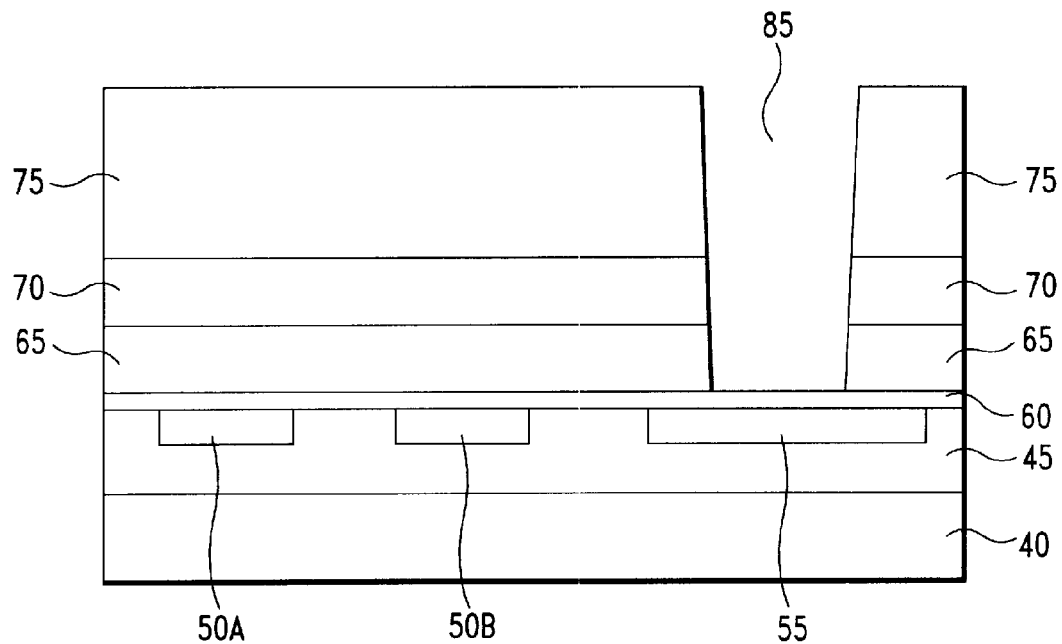
Figure 5E:
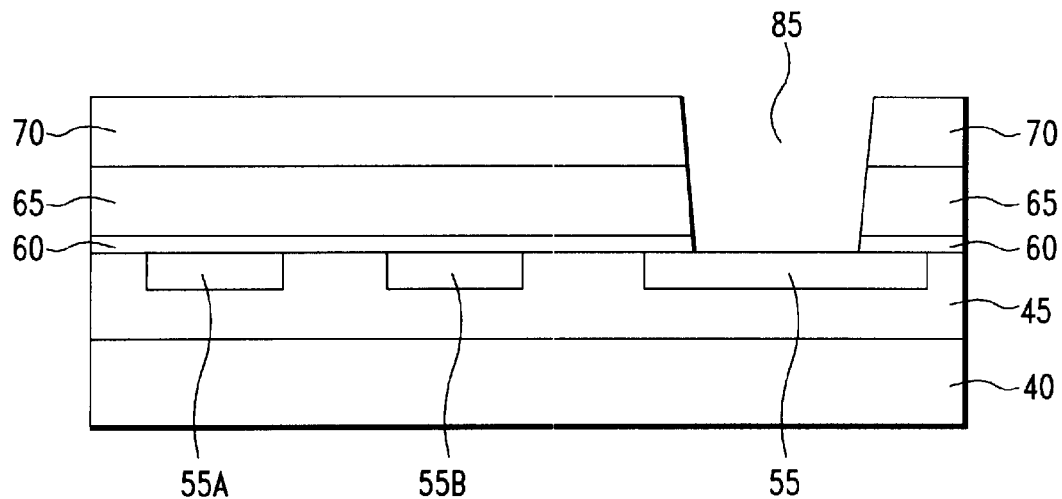
Figure 5F:
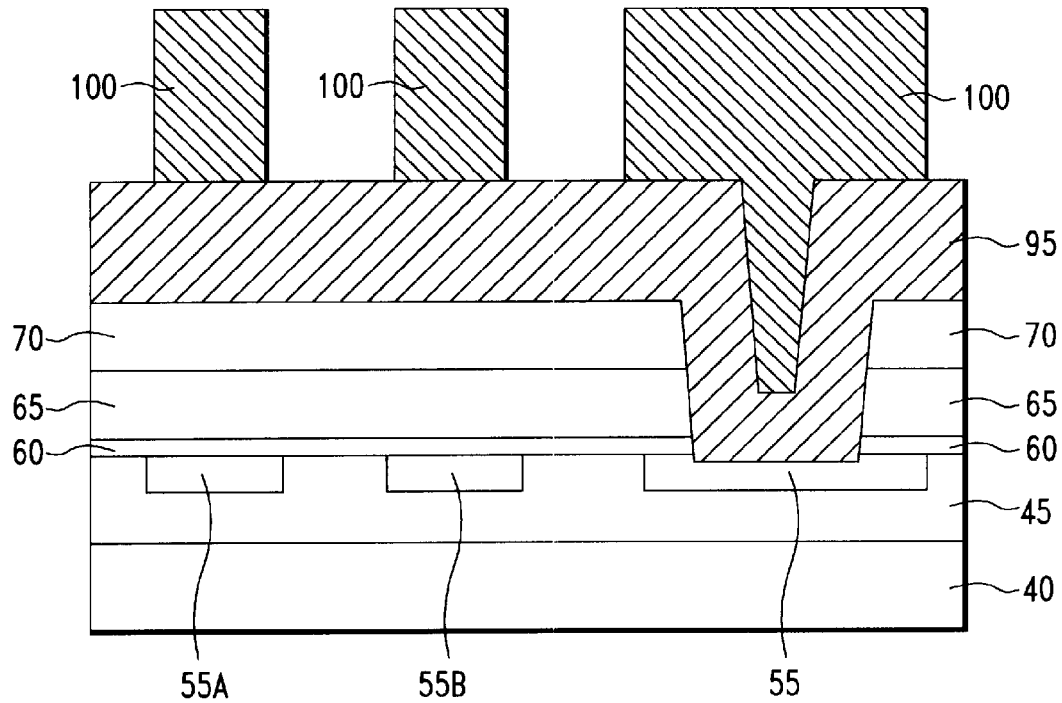

Referring to FIG. 5C, a masking layer 75 (e.g. photoresist) is formed by a conventional photolithographic process on dielectric layer 70 having opening 85. A conventional etch process (e.g. reactive ion etch) is performed to remove exposed portions of dielectric layers 65 and 70 as shown in FIG. 5D. Dielectric layer 60 protects interconnect structure 55 during the removal of masking layer 75. Masking layer 75 is removed and an exposed portion of dielectric layer 60 is removed resulting in opening 85 extending through dielectric layers 60, 65, 70. Referring to FIG. 5F, a conductor layer 95 (preferably aluminum) is formed on dielectric layer 70 filling opening 85. Conductor layer 95 can be formed by conventional deposition processes such as, for example, physical vapor deposition, evaporation or sputtering. A masking layer 100 (e.g photoresist) is formed over the final passivation hard dielectric and photosensitive polyimide PSPI by a known photolithographic process on conductor layer 95 and above fuses 50A and 50B as a pad level shape 102 that is used as hard etch stop over each fuse 50A and 50B as shown in FIG. 5G.

Figure 5G:
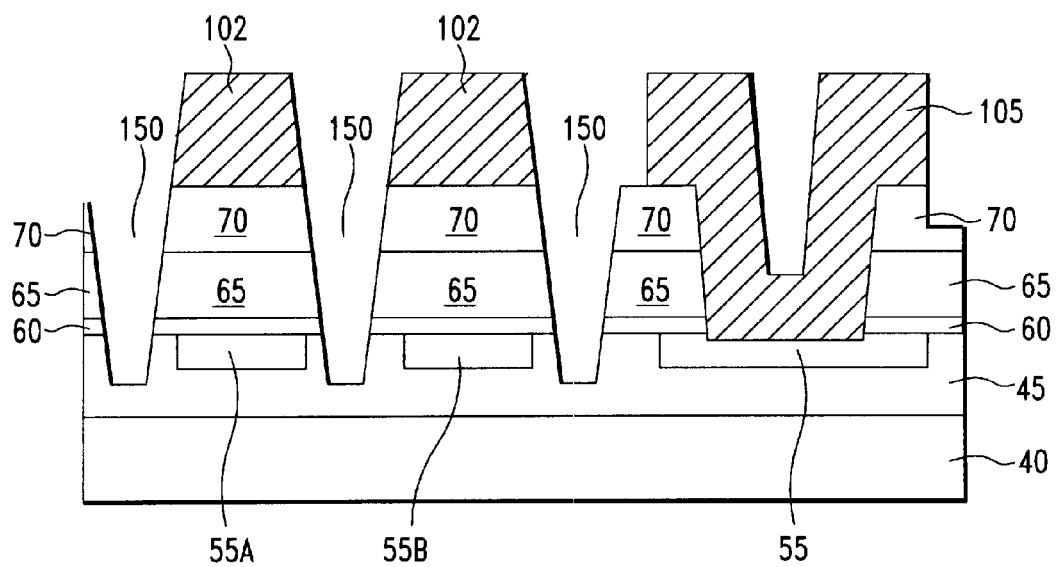

Referring to FIG. 5G, exposed portions of conductor layer 95 are removed by a conventional process such as, for example, a reactive ion etch, to substantially simultaneously form an interconnect structure 105 (e.g. a conductive transfer pad such as a wire bond pad or a C4 landing pad) and pad level shape 102 is above fuse 50A and fuse 50B. Additional layers of dielectric materials may be deposited. After which the additional layers are removed exposing the interconnect 105 and pad level shapes 102. The area between the fuses 50 are "over-etched" to remove the dielectric layers from between the fuses 50 creating a crack stop voids 150 formed extending into low-k dielectric layer 45. Over-etch 110 of conductor layer 95 may reduce the thickness of layer 70 that is not covered by conductive transfer pad 105. The over-etch determines the depth of crack stop void 150 in low-k dielectric layer 45. As shown in FIG. 5G, conductive transfer pad 105 is in direct physical and electrical contact with wiring pad 55. It should be understood that the pad level shapes 102 could be formed simultaneously with other interconnect structures such as, for example, vias, test probing pad connect structures or BEOL passive devices.

As shown in FIG. 5G intentionally places the conductive pad level shapes 102 over the fuses 50 during fabrication of the wiring pad 55. The conductive pad level shapes 102 then acts as an etch stop layer over the fuse, for etching of hard dielectric final passivation material in the creation of the final via opening over the wiring pad 55. The advantage is that the thickness of hard dielectric passivation underneath the conductor layer is not consumed at all during the etching associated with the creation of the interconnect structure 105 over the wiring pad 55. This leaves a well-controlled and uniform thickness of passivation material layers 60, 65, and 70 over the fuses 50 so that when a laser fuse blow is performed, all the fuse structures look identical, and have similar laser delete characteristics. In the more typical case today, without this kind of built-in control, it is possible to have fuses with variable dielectric coverage thicknesses which results in a fuse blow process having a much smaller process window.

Figure 5H:
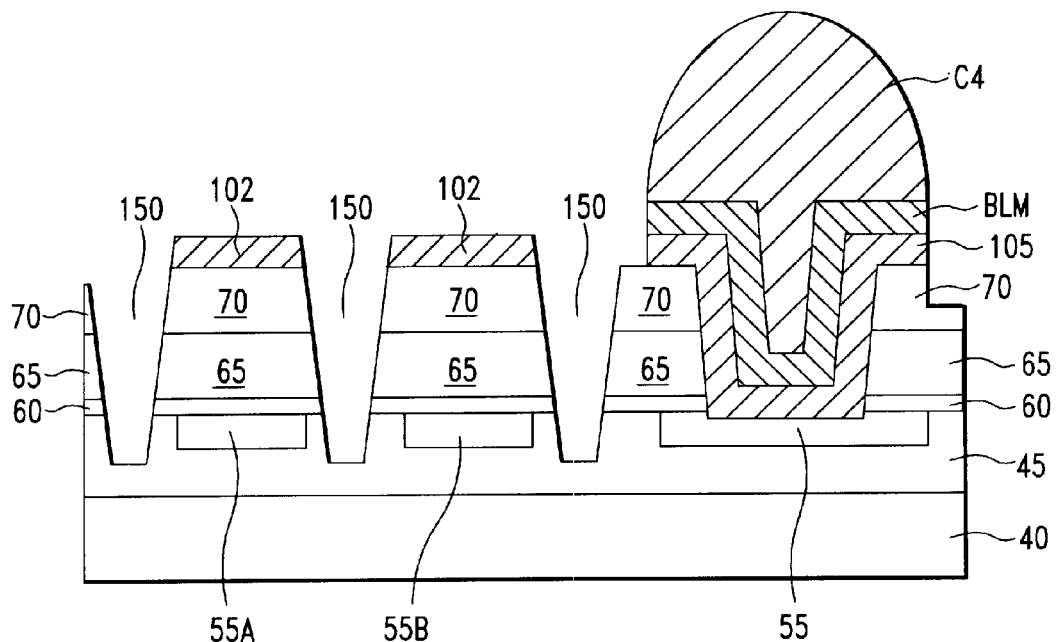

The pad level conductor shapes 102 above the layers 60, 65, and 70 that overlie the fuse 50 should be removed after the C4 is formed by wet etching, such as a HCl based etching material, prior to laser activating a fuse blow as shown in FIG. 5H. All the other layers 60, 65, and 70 between the shape 102 and the fuse 50 itself stay in the stack, intact over the fuse. This works because all of the dielectric materials are transparent to the laser. The conducting material of the shapes 102 is opaque to the laser, so it must be removed prior to laser delete in order to enable contact of the laser with the fuse, to affect the actual fuse blow.

Since the formation of crack stop void 150 and the formation of the passivation layer over the fuse are accomplished simultaneously with the formation of conductive transfer pad 105, additional processing steps dedicated only to the formation of crack stop void 150 are not required. Thus, reductions in fabrication costs and time are achieved.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

The invention claimed is:

1. A method comprising the steps of:
   providing a substrate including a plurality of fuse structures formed thereupon;
   forming a dielectric layer over the fuse structures;
   forming a conductor layer over an interconnect structure and a disposable conductive hard etch stop shape over each of the fuse structures wherein the etch stop controls the intermediate dielectric layer above each ones of the fuse structures; and
   forming a material-free region between adjacent ones of said fuse structure.

2. The method of claim 1, wherein said step of forming a material-free region includes removing a portion of the dielectric layer in which said adjacent fuse structures are formed.

3. The method of claim 1, wherein said material-free region comprises a fluid or vacuum.

4. The method of claim 1, wherein said interconnect structure comprises a conductive transfer pad, said conductive transfer pad coupled to a wiring pad.

5. The method of claim 1 which includes a step of removing the hard etch shapes prior to a fuse blow operation.

6. The method of claim 2, wherein said step of removing a portion of said dielectric layer occurs during an over-etch of said portion of said conductor layer.

7. The method of claim 2, wherein said dielectric layer comprises a low-k dielectric material.

8. The method of claim 2, wherein said dielectric layer comprises a silicon oxide dielectric material.

9. A method comprising the steps of:
   providing a substrate including a plurality of fuse structures formed in a first dielectric layer;
   forming at least a second dielectric layer over said plurality of fuse structures;
   forming a conductor layer on said second dielectric layer;
   patterning the conductor layer to simultaneously form an interconnect structure, and a conductive hard etch stop shape over each ones of the fuse structures in order accurately position an intermediate passivation layer above the fuse structures;
   forming an opening in said at least second dielectric layer between adjacent ones of said fuse structures to create a void wherein the void prevents propagation of cracks between said adjacent fuse structures during a fuse blow operation, and
   removing the hard etch stop shape prior to a fuse blow operation.

10. The method of claim 9, wherein said void extends into said first dielectric layer.

11. The method of claim 9, wherein said first dielectric layer comprises a low-k dielectric material.

12. The method of claim 9, wherein the step of patterning includes forming a second interconnect structure.

13. The method of claim 9, wherein said first interconnect structure comprises one of a conductive transfer pad, a via, a pad connect structure or a BEOL passive device.

14. The method of claim 9, wherein said step of forming said at least second dielectric layer comprises:
    forming a first silicon nitride layer;
    forming a silicon oxide layer on said first silicon nitride layer; and
    forming a second silicon nitride layer on said silicon oxide layer.

15. The method of claim 9, wherein said step of forming said opening in said at least second dielectric layer comprises:
    forming a photoresist layer on said at least second dielectric layer;
    exposing and developing said photoresist layer; and
    etching exposed portions of said at least second dielectric layer to form said opening.

16. The method of claim 9, wherein said step of patterning said conductor layer comprises:
    forming a photoresist layer on said conductor layer;
    exposing and developing said photoresist layer; and
    removing an exposed portion of said conductor layer, wherein a remaining portion of the conductor layer forms said first interconnect structure and the hard edge stop.

17. The method of claim 10, wherein said void extends to a depth below a lower surface of said adjacent fuse structures.

18. The method of claim 11, wherein said low-k dielectric material is selected from one of hydrogen silsesquioxane polymer (HSQ), methyl silsesquioxane polymer (MSQ), polyphenylene oligomer, $SiO_x(CH3)_y$, and fluorinated TEOS (FTEOS) and fluorinated silicon glass (FSG).

19. The method of claim 12, wherein said second interconnect structure comprises a wiring pad.

20. The method of claim 16, wherein the void comprises a fluid or vacuum.

* * * * *